United States Patent
Hsieh et al.

(10) Patent No.: US 9,532,129 B2
(45) Date of Patent: Dec. 27, 2016

(54) EARPHONE LINE CONTROL DEVICE AND EARPHONE

(71) Applicant: 1MORE INC., Shenzhen, Guandong (CN)

(72) Inventors: Kuan-Hong Hsieh, Guangdong (CN); Boqing Lin, Guangdong (CN); Xiaohong Sun, Guangdong (CN)

(73) Assignee: 1MORE INC., Shenzhen, Guangdong (CN)

( * ) Notice: Subject to any disclaimer, the term of this patent is extended or adjusted under 35 U.S.C. 154(b) by 164 days.

(21) Appl. No.: 14/402,088

(22) PCT Filed: Sep. 24, 2014

(86) PCT No.: PCT/CN2014/087246
§ 371 (c)(1),
(2) Date: Nov. 18, 2014

(87) PCT Pub. No.: WO2015/078226
PCT Pub. Date: Jun. 4, 2015

(65) Prior Publication Data
US 2015/0289049 A1   Oct. 8, 2015

(30) Foreign Application Priority Data
Nov. 27, 2013   (CN) .......................... 2013 1 0636584

(51) Int. Cl.
*H04R 1/10*   (2006.01)
*H04R 3/00*   (2006.01)
(Continued)

(52) U.S. Cl.
CPC ........... *H04R 1/1041* (2013.01); *G06F 1/1632* (2013.01); *G06F 1/305* (2013.01); *G06F 1/3203* (2013.01);
(Continued)

(58) Field of Classification Search
CPC ......... H04R 1/1041; H04R 3/00; H04R 27/00; H04R 2227/003; H04R 29/001; H04R 2420/07; G06F 1/325; G06F 1/3203; G06F 1/305; G06F 1/1632; H03G 3/007; H03G 7/002
(Continued)

(56) References Cited

U.S. PATENT DOCUMENTS 6,011,382 A  *  1/2000  Littlefield ............... H02M 1/44
                                                    323/222
6,469,481 B1 * 10/2002  Tateishi .............. H02M 3/1588
                                                    323/282
(Continued)

FOREIGN PATENT DOCUMENTS

CN         2653799 Y   * 11/2004
CN       101841753 A   *  9/2010
CN       201774654 U   *  3/2011

*Primary Examiner* — Davetta W Goins
*Assistant Examiner* — Kuassi Ganmavo
(74) *Attorney, Agent, or Firm* — James F. Hann; Haynes Beffel & Wolfeld LLP

(57) ABSTRACT

An earphone line control device includes a power supply management unit, a filter unit, a control unit, a first resistance, a first diode, a first switch, a second resistance and a second switch. A first end of the power supply management unit, a first end of the filter unit, an end of the first resistance, and an end of the second resistance are all connected to a power supply; the other end of the first resistance is connected to an anode of the first diode, a cathode of the first diode is connected to an end of the first switch, the other end of the second resistance is connected to an end of the second switch, the other end of the first switch and the other end of the second switch are both connected to ground; a first end and a third end of the control unit are respectively connected to the cathode of the first diode and the other end of the second resistance, a second end of the control unit is
(Continued)

connected to ground, a fourth end of the control unit is connected to the other end of the filter unit; a second end of the power supply management unit is connected to ground, a third end of the power supply management unit is connected to the control unit. When the first switch or the second switch is turned off, the control unit outputs a preset coded pulse signal.

18 Claims, 8 Drawing Sheets

(51) Int. Cl.
  *H04R 29/00* (2006.01)
  *G06F 1/16* (2006.01)
  *G06F 1/30* (2006.01)
  *G06F 1/32* (2006.01)
  *H03G 3/00* (2006.01)
  *H04R 27/00* (2006.01)

(52) U.S. Cl.
  CPC .............. *G06F 1/325* (2013.01); *H03G 3/002* (2013.01); *H03G 3/007* (2013.01); *H04R 3/00* (2013.01); *H04R 27/00* (2013.01); *H04R 29/001* (2013.01); *H04R 2227/003* (2013.01); *H04R 2420/07* (2013.01); *H04R 2460/03* (2013.01)

(58) Field of Classification Search
  USPC .................. 340/661, 664; 324/120, 508, 522
  See application file for complete search history.

(56) References Cited

U.S. PATENT DOCUMENTS

| | | | | |
|---|---|---|---|---|
| 7,010,332 B1* | 3/2006 | Irvin | ....................... | H04M 1/05 379/106.02 |
| 7,500,114 B2* | 3/2009 | Oh | ........................ | G06F 1/206 713/300 |
| 8,049,473 B2* | 11/2011 | Hu | ........................ | H02M 3/156 323/271 |
| 2003/0080718 A1* | 5/2003 | McDonald | ............ | H02M 3/156 323/286 |
| 2007/0076897 A1* | 4/2007 | Philipp | ................ | H04R 1/1041 381/74 |
| 2008/0175420 A1* | 7/2008 | Chung | ..................... | H04R 5/02 381/309 |
| 2009/0179625 A1* | 7/2009 | Liu | ...................... | H02M 3/1588 323/285 |
| 2009/0198460 A1* | 8/2009 | Carroll | ............... | G01R 19/2513 702/60 |
| 2009/0287946 A1* | 11/2009 | Lin | ....................... | G06F 1/3203 713/323 |
| 2011/0187311 A1* | 8/2011 | Zhao | ..................... | H01M 10/46 320/101 |
| 2013/0223641 A1* | 8/2013 | Lin | .................. | H04M 1/72527 381/77 |

* cited by examiner

EARPHONE LINE CONTROL DEVICE AND EARPHONE

FIELD OF THE INVENTION

The invention relates to a field of earphone, and more particularly relates to an earphone line control device and an earphone.

BACKGROUND OF THE INVENTION

Due to the development of terminal technique, more and more terminal devices appear nowadays. In order to provide the terminal device with enhanced processing ability and more functions operating systems for terminal devices are developed. Currently, there are a variety of operating systems, of which the most widely used systems are Android, iOS, Symbian, Windows Phone, and BlackBerry OS.

Mobile phones with different operating systems require different earphones, which cause an earphone fail to be used with different mobile phones. For example, an earphone provided for an Android mobile phone cannot be used with an iOS mobile phone, and vice versa.

SUMMARY OF THE INVENTION

Accordingly, it is necessary to provide an earphone line control device to make an earphone be generally used on different terminal devices.

An earphone line control device comprising a power supply management unit, a filter unit, a control unit, a first resistance, a first diode, a first switch, a second resistance and a second switch, wherein a first end of the power supply management unit, a first end of the filter unit, an end of the first resistance, and an end of the second resistance are all connected to a power supply; the other end of the first resistance is connected to an anode of the first diode, a cathode of the first diode is connected to an end of the first switch, the other end of the second resistance is connected to an end of the second switch, the other end of the first switch and the other end of the second switch are both connected to ground; a first end and a third end of the control unit are respectively connected to the cathode of the first diode and the other end of the second resistance, a second end of the control unit is connected to ground, a fourth end of the control unit is connected to the other end of the filter unit; a second end of the power supply management unit is connected to ground, a third end of the power supply management unit is connected to the control unit; the first switch corresponds to the first resistance, the second switch corresponds to the second resistance; when the first switch or the second switch is turned on, the control unit outputs a first preset coded pulse signal, the first resistance or the second resistance divides voltage with an internal circuit of a mobile phone and generates a different voltage value; when the first switch or the second switch is turned off, the control unit outputs a second preset coded pulse signal.

In an embodiment, when the first switch or the second switch is turned on, the control unit respectively outputs a first preset coded pulse signal with different frequency.

In an embodiment, the earphone line control device further includes a third switch, an end of the third switch is connected to a sixth end of the control unit, the other end of the third switch is connected to ground; when the third switch is turned on, the control unit outputs a third preset coded audio signal.

In an embodiment, the power supply management unit includes a second diode and a first capacitance, wherein an anode of the second diode is connected to the power supply, a cathode of the second diode is connected to an end of the first capacitance, the other end of the first capacitance is connected to ground.

In an embodiment, the filter unit includes a second capacitance connecting in series with a fourth resistance.

In an embodiment, a forth end of the power supply management unit is connected to the first end of the control unit.

In an embodiment, the earphone line control device further includes a third switch, an end of the third switch is connected to a sixth end of the control unit, the other end of the third switch is connected to ground; when the third switch is turned on, the control unit outputs a third preset coded pulse signal.

In an embodiment, the power supply management unit includes a second diode, a third resistance and a first capacitance, wherein an anode of the second diode is connected to the power supply, a cathode of the second diode is connected to an end of the third resistance and an end of the first capacitance, the other end of the third resistance is connected to the first end of the control unit, the other end of the first capacitance is connected to ground.

In an embodiment, the filter unit includes a second capacitance connecting in series with a fourth resistance.

Furthermore, it is also necessary to provide an earphone that can be generally used on different terminal devices.

An earphone includes the earphone line control device described in one of the above embodiments.

The earphone line control device can make the earphone be generally used on at least two different terminal devices.

DETAILED DESCRIPTION OF THE EMBODIMENTS

Figure 1:
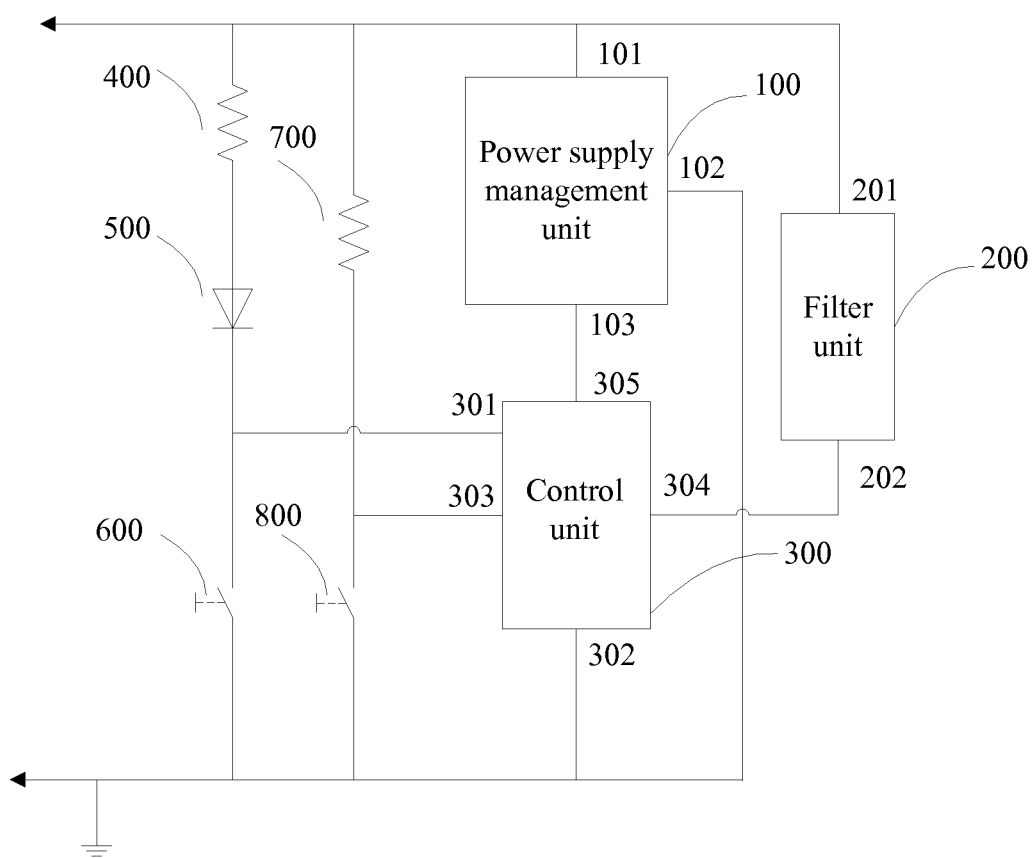
FIG. 1 is a block diagram of an earphone line control device in accordance with an embodiment

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete, and will fully convey the scope of the invention to those skilled in the art. Elements that are identified using the same or similar reference characters refer to the same or similar elements.

Referring to FIG. 1, FIG. 1 is a block diagram of an earphone line control device in accordance with an embodiment.

The earphone line control device includes a power supply management unit 100, a filter unit 200, a control unit 300, a first resistance 400, a first diode 500, a first switch 600 and a second resistance 700, and a second switch 800. A first end 101 of the power supply management unit 100, a first end 201 of the filter unit 200, an end of the first resistance 400, and an end of the second resistance 700 are all connected to a power supply. The other end of the first resistance 400 is connected to an anode of the first diode 500, a cathode of the first diode 500 is connected to an end of the first switch 600, the other end of the second resistance 700 is connected to an end of the second switch 800, the other end of the first switch 600 and the other end of the second switch 800 are both connected to ground. A first end 301 and a third end 303 of the control unit 300 are respectively connected to the cathode of the first diode 500 and the other end of the second resistance 700, a second end 302 of the control unit 300 is connected to ground, a fourth end 304 of the control unit 300 is connected to the other end 202 of the filter unit 200. A second end 102 of the power supply management unit 100 is connected to ground, and a third end 103 of the power supply management unit 100 is connected to the control unit 300.

In an embodiment, when the first switch 600 is turned on, the first end 301 of the control unit 300 detects a low level, the control unit 300 outputs nothing, and the first resistance 400 corresponding to the first switch 600 divides voltage with an internal circuit of a mobile phone. The mobile phone distinguishes whether the first switch 600 or the second switch 800 is turned on according to the voltage value divided by the first resistance 400 or the second resistance 700, so as to implements volume regulating or song moves previous/moves next functions of an earphone under a kind of operation system (as Android).

At the moment the first switch 600 or the second switch 800 turns to off state from on state, the first end 301 or the third end 303 of the control unit 300 detects a high level, and the control unit 300 outputs preset coded pulse signal.

When the first switch 600 is turned off, the control unit 300 outputs coded pulse signal with a frequency of about 154 KHz. The filter unit 200 superimpose the preset coded pulse signal output by the control unit 300 to the main circuit and sends the superimposed signal to the mobile phone connected with the earphone, and the mobile phone distinguishing the finished action of the first switch 600 or the second switch 800 according to the coded pulse signal, so as to achieve the volume regulating or song move previous/move next operation under another operation system (as iOS).

In another embodiment, for example, an earphone is connected to an Android mobile phone, when insertion, the control unit 300 generates a coded pulse signal with a frequency of 270 KHz (0.9 ms)+130 KHz (5.5 ms) and sends it to the mobile phone, so as to initialize the earphone. However, the Android mobile phone cannot identify the coded pulse signal and thus it gives no response to the signal.

When the first switch 600 is turned on, the first end 301 of the control unit 300 detects a low level, and the first resistance 400 corresponding to the first switch 600 divides voltage with an internal circuit of the mobile phone. The Android mobile phone distinguishes the action of turning on the first switch 600 according to the voltage value divided by the first resistance 400 and gives a response; the control unit 300 generates a first preset coded pulse signal with a frequency of 270 KHz (0.9 ms)+130 KHz (5.5 ms) and sends it to the Android mobile phone connected with the earphone line-control device, but the Android mobile phone cannot identify the first preset coded pulse signal so it gives no response to the signal.

Similarly, when the second switch 800 is turned on, the third end 303 of the control unit 300 detects a low level, and the second resistance 700 corresponding to the second switch 800 divides voltage with internal circuit of the mobile phone. The Android mobile phone distinguishes the action of turning on the second switch 800 according to the voltage value divided by the second resistance 700 and gives a response; the control unit 300 generates a first preset coded pulse signal with a frequency of 270 KHz (0.9 ms)+165 KHz (1.8 ms) and sends it to the Android mobile phone connected with the earphone line-control device, but the Android mobile phone cannot identify the first preset coded pulse signal so it gives no response to the signal.

The Android mobile phone distinguishes whether the first switch 600 or the second switch 800 is turned on according to the voltage value divided by the first resistance 400 or the second resistance 700, so as to implement volume regulating or song moves previous/moves next functions of an earphone under Android operating system.

When the first switch 600 or the second switch 800 is turned off, that is at the moment the switch turns to off state from on state, the control unit 300 detects a high level and outputs a second preset coded pulse signal with a frequency of 270 KHz (0.9 ms)+95 KHz (1.8 ms), but the Android mobile phone cannot identify the second preset coded pulse signal, so it gives no response to the signal.

In the embodiment, for example, an earphone is connected to an iOS mobile phone, in the moment of insertion, the control unit 300 generates a coded pulse signal with a frequency of 270 KHz (0.9 ms)+130 KHz (5.5 ms) and sends it to the mobile phone, so as to initialize the earphone.

When the first switch 600 is turned on, the first end 301 of the control unit 300 detects a low level, and the control unit 300 generates a first preset coded pulse signal with a frequency of 270 KHz (0.9 ms)+130 KHz (5.5 ms) and sends it to the iOS mobile phone connected with the earphone line-control device. The iOS mobile phone distinguishes the first preset coded pulse signal and gives a response. The first resistance 400 corresponding to the first switch 600 divides voltage with a circuit within the mobile phone, but the iOS mobile phone cannot identify the voltage value divided by the first resistance 400 so it gives no response.

Similarly, when the second switch 800 is turned on, the third end 303 of the control unit 300 detects a lowlevel, and the control unit 300 generates a first preset coded pulse signal with a frequency of 270 KHz (0.9 ms)+165 KHz (1.8 ms) and sends it to the iOS mobile phone connected with the earphone line-control device. The iOS mobile phone distinguishes the first preset coded pulse signal and gives a response. The second resistance 700 corresponding to the second switch 800 divides voltage with an internal circuit of the mobile phone, but the iOS mobile phone cannot identify the voltage value divided by the second resistance 700 so it gives no response.

The iOS mobile phone distinguishes whether the first switch 600 or the second switch 800 is turned on according to the first preset coded pulse signal, so as to implement volume regulating or song move previous/move next functions of an earphone under iOS operating system.

When the first switch 600 or the second switch 800 is turned off, that is at the moment the switch turns to off state from on state, the control unit 300 detects a high level and outputs a second preset coded pulse signal with a frequency of 270 KHz (0.9 ms)+95 KHz (1.8 ms). The filter unit 200 superimpose the second preset coded pulse signal output by the control unit 300 to the main circuit and sends the superimposed signal to the mobile phone connected with the earphone, and the mobile phone distinguishing the finished action of the first switch 600 or the second switch 800 according to the coded pulse signal, that is the volume regulating or song move previous/move next operation is over.

In the above embodiments, the first diode 500 plays an important role. When the second switch 800 is turned on, the second resistance 700 divides voltage with internal circuit of the mobile phone, and the third end 303 of the control unit 300 detects a low level, without the first diode 500, the first end 301 of the control unit 300 will detects a low level too, and causes an incorrect operation.

Figure 2:
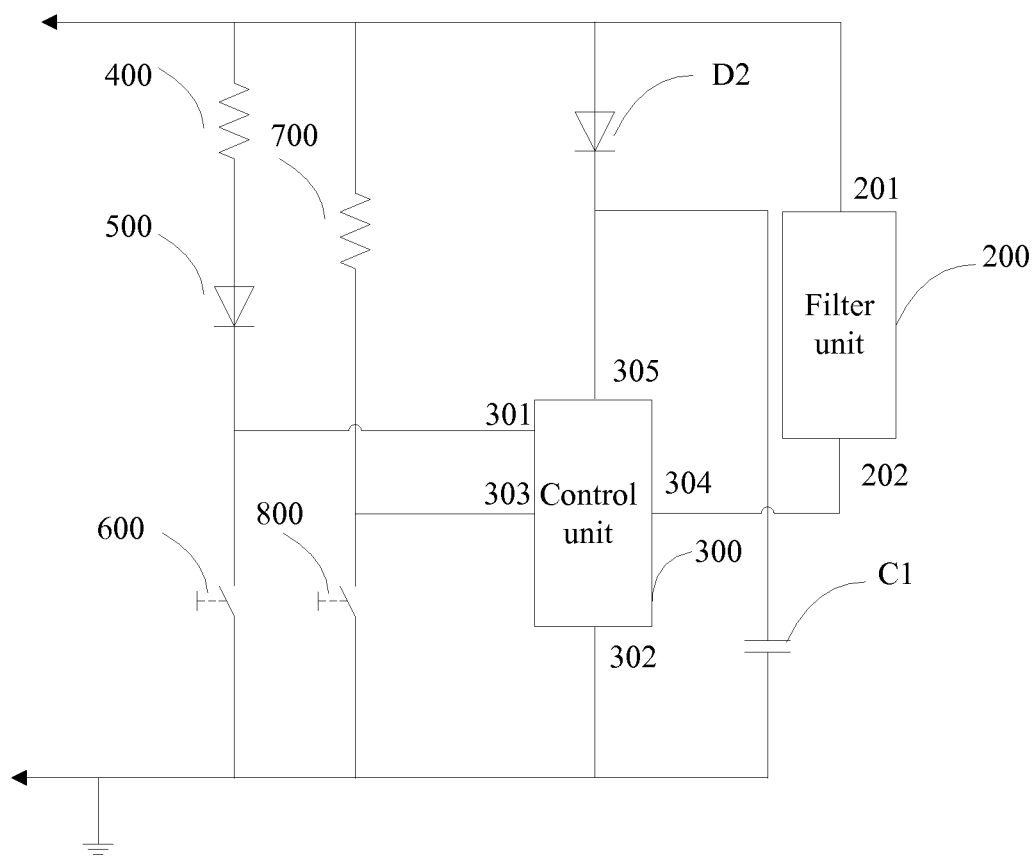
FIG. 2 is a block diagram of an earphone line control device in accordance with another embodiment.

Referring to FIG. 2, FIG. 2 is a block diagram of an earphone line control device in accordance with another embodiment. In the embodiment, the power supply management unit 100 includes a second diode D2 and a first capacitance C1, wherein the anode of the second diode D2 is connected to the power, and the cathode of the second diode D2 is connected to an end of the first capacitance C1, while the other end of the first capacitance C1 is connected to ground. The first capacitance C1 may be composed by a combination of two parallel capacitances.

The power supply management unit 100 is configured to provide stable power for the control unit 300. The first capacitance C1 can stabilize the voltage, follow current, and supply power for the control unit 300. Without the second diode D2, the voltage may be too low and the first capacitance C1 will electro-discharge too fast, which will cause the mobile phone crashed, and fail to work normally.

Figure 3:
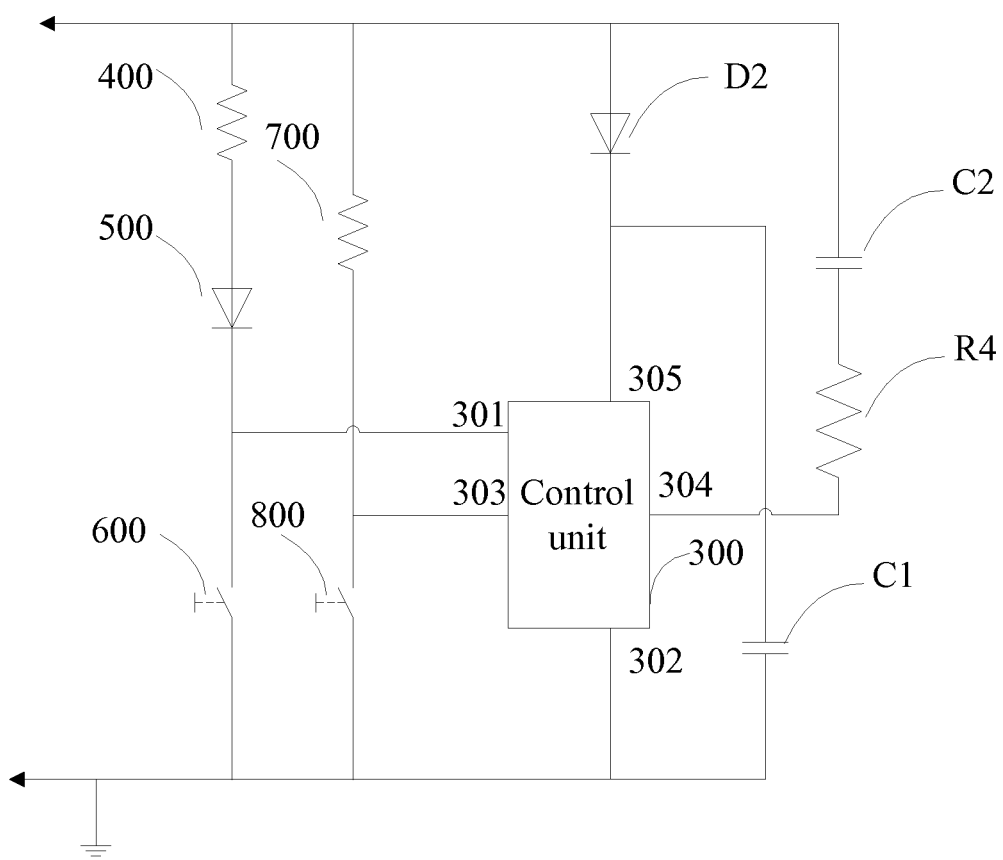
FIG. 3 is a block diagram of an earphone line control device in accordance with another embodiment.

Referring to Fig.3, FIG. 3 is a block diagram of an earphone line control device in accordance with another embodiment. In the embodiment, the filter unit 200 consists of a second capacitance C2 connecting in series with a fourth resistance R4.

Figure 4:
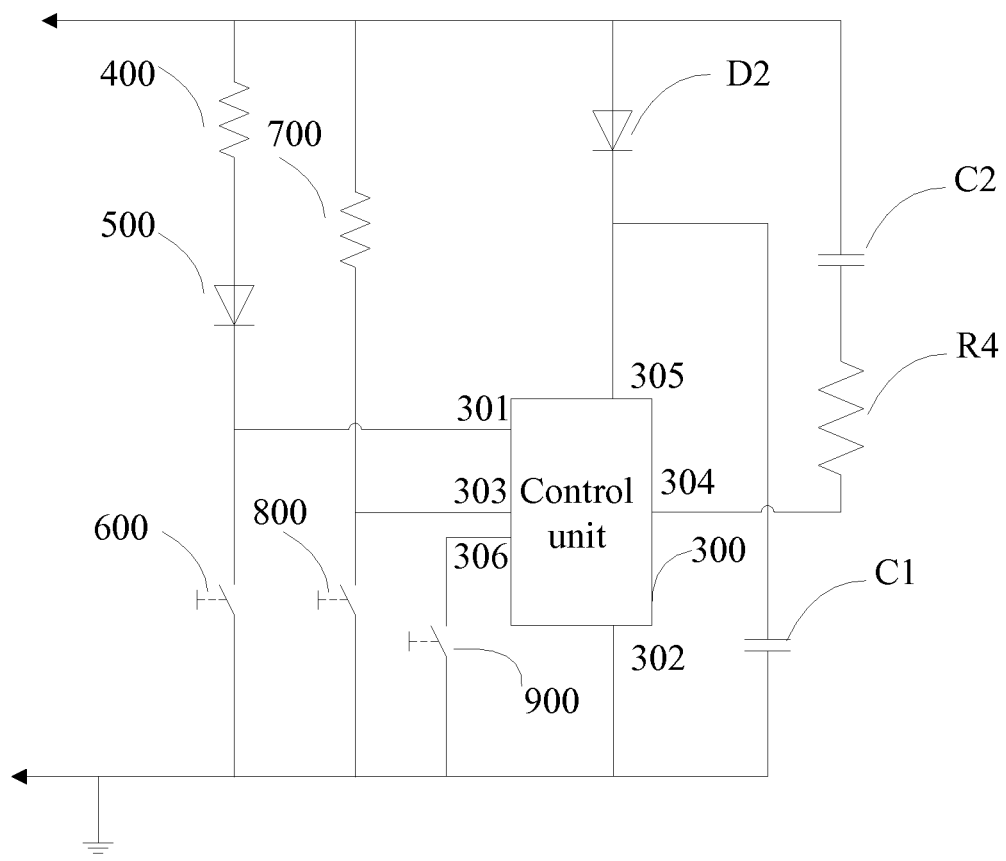
FIG. 4 is a block diagram of an earphone line control device in accordance with another embodiment.

Referring to FIG. 4, FIG. 4 is a block diagram of an earphone line control device in accordance with another embodiment. The earphone line control device further includes a third switch 900. An end of the third switch 900 is connected to the sixth end 306 of the control unit 300, and the other end of the third switch 900 is connected to ground. When the third switch 900 is turned on or turned off, the control unit 300 outputs a third preset coded pulse signal, the mobile phone connected to the earphone decodes the coded pulse signal, and implements different functions by running different application programs (APP), e.g. leaving wechat voice massages, playing wechat voice massages, taking photos, turning volume up/down, song move previous/move next, screen scraping, and voice controlling.

In an embodiment, the coded pulse signal is a low frequency stage signal in the range of 20 HZ-20 KHZ.

In another embodiment, the first switch is a VOL DOWN (-) switch of the earphone line control device, the second switch is a VOL UP (+) switch of the earphone line control device, and the third switch is a PLAY/PAUSE switch of the earphone line control device. The control unit 300 achieves different functions by detecting the on or off state of above-described three switches.

Figure 5:
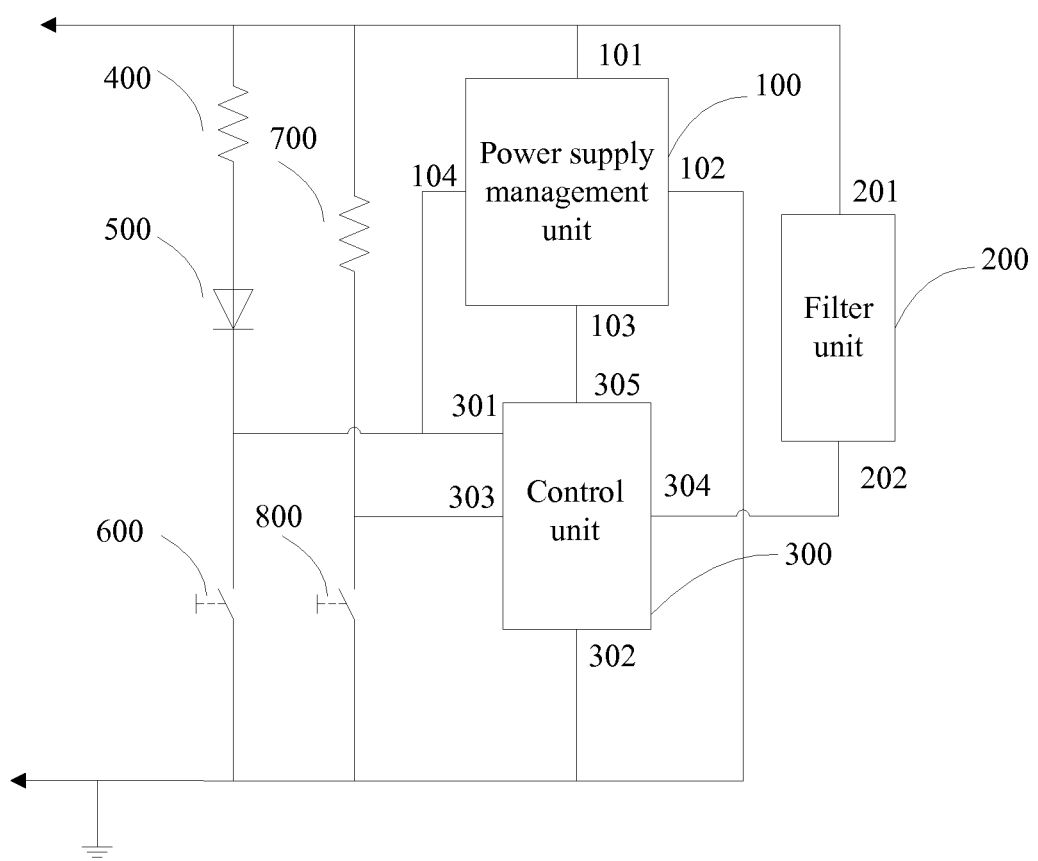
FIG. 5 is a block diagram of an earphone line control device in accordance with another embodiment.

Referring to FIG. 5, FIG. 5 is a block diagram of an earphone line control device in accordance with another embodiment.

The earphone line control device includes a power supply management unit 100, a filter unit 200, a control unit 300, a first resistance 400, a first diode 500, a first switch 600, a second resistance 700, and a second switch 800. A first end 101 of the power supply management unit 100, a first end 201 of the filter unit 200, an end of the first resistance 400, and an end of the second resistance 700 are all connected to power supply. The other end of the first resistance 400 is connected to an anode of the first diode 500, a cathode of the first diode 500 is connected to an end of the first switch 600, the other end of the second resistance 700 is connected to an end of the second switch 800, the other end of the first switch 600 and the other end of the second switch 800 are both connected to ground. A first end 301 and a third end 303 of the control unit 300 are respectively connected to the cathode of the first diode 500 and the other end of the second resistance 700, a second end 302 of the control unit 300 is connected to ground, a fourth end 304 of the control unit 300 is connected to the other end 202 of the filter unit 200. A second end 102 of the power supply management unit 100 is connected to ground, and a third end 103 of the power supply management unit 100 is connected to the control unit 300. A forth end 104 of the power supply management unit 100 is connected to first end 301 of the control unit 300.

In an embodiment, when the first switch 600 is turned on, the first end 301 of the control unit 300 detects a low level, the control unit 300 outputs nothing, and the first resistance 400 corresponding to the first switch 600 divides voltage with an internal circuit of a mobile phone. The mobile phone distinguishes whether the first switch 600 or the second switch 800 is turned on according to the voltage value divided by the first resistance 400 or the second resistance 700, so as to implements volume regulating or song moves previous/moves next functions of an earphone under a kind of operation system (as Android).

At the moment the first switch 600 or the second switch 800 turns to off state from on state, the first end 301 or the third end 303 of the control unit 300 detects a high level, and the control unit 300 outputs preset coded pulse signal.

When the first switch 600 is turned off, the control unit 300 outputs coded pulse signal with a frequency of about 154 KHz. The filter unit 200 superimpose the preset coded pulse signal output by the control unit 300 to the main circuit and sends the superimposed signal to the mobile phone connected with the earphone, and the mobile phone distinguishing the finished action of the first switch 600 or the second switch 800 according to the coded pulse signal, so as to achieve the volume regulating or song move previous/move next operation under another operation system (as iOS).

In another embodiment, for example, an earphone is connected to an Android mobile phone, when insertion, the control unit 300 generates a coded pulse signal with a frequency of 270 KHz (0.9 ms)+130 KHz (5.5 ms) and sends it to the mobile phone, so as to initialize the earphone. However, the Android mobile phone cannot identify the coded pulse signal and thus it gives no response to the signal.

When the first switch 600 is turned on, the first end 301 of the control unit 300 detects a low level, and the first resistance 400 corresponding to the first switch 600 divides voltage with an internal circuit of the mobile phone. The Android mobile phone distinguishes the action of turning on the first switch 600 according to the voltage value divided by the first resistance 400 and gives a response; the control unit 300 generates a first preset coded pulse signal with a frequency of 270 KHz (0.9 ms)+130 KHz (5.5 ms) and sends it to the Android mobile phone connected with the earphone line-control device, but the Android mobile phone cannot identify the first preset coded pulse signal so it gives no response to the signal.

Similarly, when the second switch 800 is turned on, the third end 303 of the control unit 300 detects a low level, and the second resistance 700 corresponding to the second switch 800 divides voltage with internal circuit of the mobile phone. The Android mobile phone distinguishes the action of turning on the second switch 800 according to the voltage value divided by the second resistance 700 and gives a response; the control unit 300 generates a first preset coded pulse signal with a frequency of 270 KHz (0.9 ms)+165 KHz (1.8 ms) and sends it to the Android mobile phone connected with the earphone line-control device, but the Android mobile phone cannot identify the first preset coded pulse signal so it gives no response to the signal.

The Android mobile phone distinguishes whether the first switch 600 or the second switch 800 is turned on according to the voltage value divided by the first resistance 400 or the second resistance 700, so as to implement volume regulating or song moves previous/moves next functions of an earphone under Android operating system.

When the first switch 600 or the second switch 800 is turned off, that is at the moment the switch turns to off state from on state, the control unit 300 detects a high level and outputs a second preset coded pulse signal with a frequency of 270 KHz (0.9 ms)+95 KHz (1.8 ms), but the Android mobile phone cannot identify the second preset coded pulse signal, so it gives no response to the signal.

In the embodiment, for example, an earphone is connected to an iOS mobile phone, in the moment of insertion, the control unit 300 generates a coded pulse signal with a frequency of 270 KHz (0.9 ms)+130 KHz (5.5 ms) and sends it to the mobile phone, so as to initialize the earphone.

When the first switch 600 is turned on, the first end 301 of the control unit 300 detects a low level, and the control unit 300 generates a first preset coded pulse signal with a frequency of 270 KHz (0.9 ms)+130 KHz (5.5 ms) and sends it to the iOS mobile phone connected with the earphone line-control device. The iOS mobile phone distinguishes the first preset coded pulse signal and gives a response. The first resistance 400 corresponding to the first switch 600 divides voltage with a circuit within the mobile phone, but the iOS mobile phone cannot identify the voltage value divided by the first resistance 400 so it gives no response.

Similarly, when the second switch 800 is turned on, the third end 303 of the control unit 300 detects a lowlevel, and the control unit 300 generates a first preset coded pulse signal with a frequency of 270Hz (0.9 ms)+165 KHz (1.8 ms) and sends it to the iOS mobile phone connected with the earphone line-control device. The iOS mobile phone distinguishes the first preset coded pulse signal and gives a response. The second resistance 700 corresponding to the second switch 800 divides voltage with an internal circuit of the mobile phone, but the iOS mobile phone cannot identify the voltage value divided by the second resistance 700 so it gives no response.

The iOS mobile phone distinguishes whether the first switch 600 or the second switch 800 is turned on according to the first preset coded pulse signal, so as to implement volume regulating or song move previous/move next functions of an earphone under iOS operating system.

When the first switch 600 or the second switch 800 is turned off, that is at the moment the switch turns to off state from on state, the control unit 300 detects a high level and outputs a second preset coded pulse signal with a frequency of 270 KHz (0.9 ms)+95 KHz (1.8 ms). The filter unit 200 superimpose the second preset coded pulse signal output by the control unit 300 to the main circuit and sends the superimposed signal to the mobile phone connected with the earphone, and the mobile phone distinguishing the finished action of the first switch 600 or the second switch 800 according to the coded pulse signal, that is the volume regulating or song move previous/move next operation is over.

In the above embodiments, the first diode 500 plays an important role. When the second switch 800 is turned on, the second resistance 700 divides voltage with internal circuit of the mobile phone, and the third end 303 of the control unit 300 detects a lowlevel, without the first diode 500, the first end 301 of the control unit 300 will detects a low-level too, and causes an incorrect operation.

Figure 6:
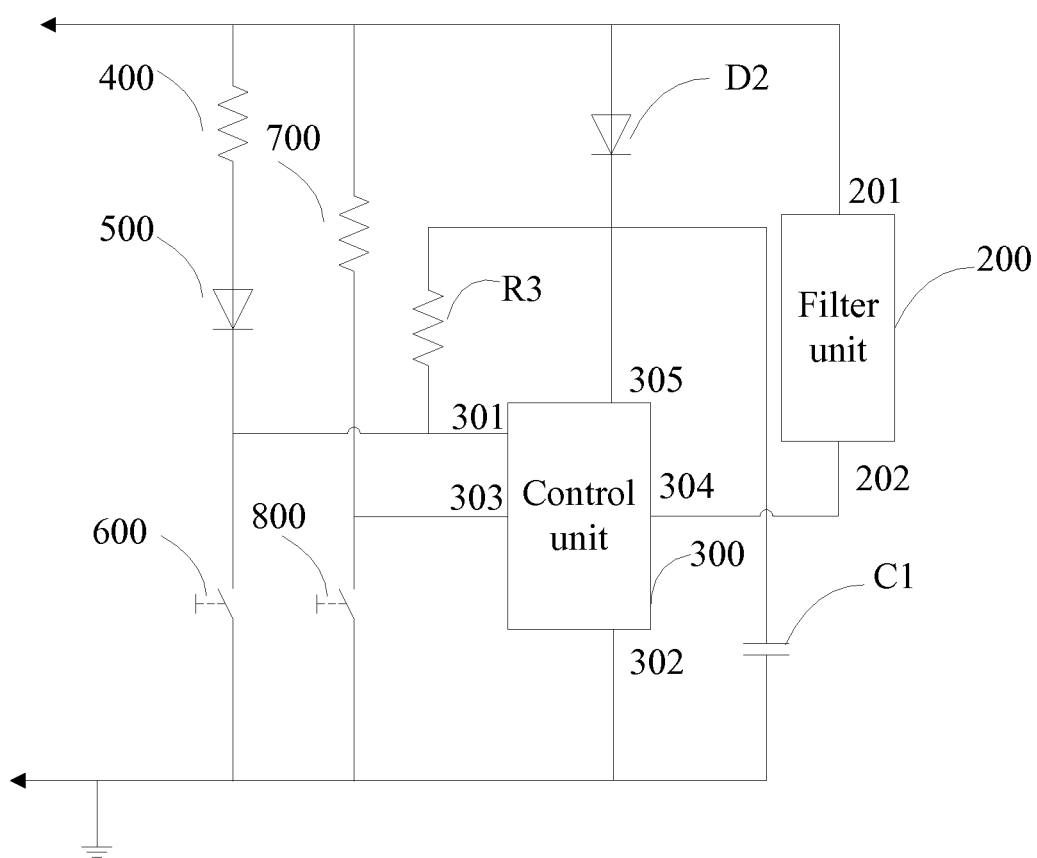
FIG. 6 is a block diagram of an earphone line control device in accordance with another embodiment.

Referring to FIG. 6, FIG. 6 is a block diagram of an earphone line control device in accordance with another embodiment. In the embodiment, the power supply management unit 100 includes a second diode D2, a third resistance R3 and a first capacitance C1, wherein the anode of the second diode D2 is connected to the power, and the cathode of the second diode D2 is connected to an end of the third resistance R3 and an end of the first capacitance C1, while the other end of the third resistance R3 is connected to first end 301 of the control unit 300, to increase the voltage of the first capacitance C1 to voltage value output from the mobile phone's earphone aperture, the other end of the first capacitance C1 is connected to ground.

The power supply management unit 100 is configured to provide stable power for the control unit 300. The first capacitance C1 can stabilize the voltage, follow current, and supply power for the control unit 300. Without the second diode D2, the voltage may be too low and the first capacitance C1 will electro-discharge too fast, which will cause the mobile phone crashed, and fail to work normally.

Figure 7:
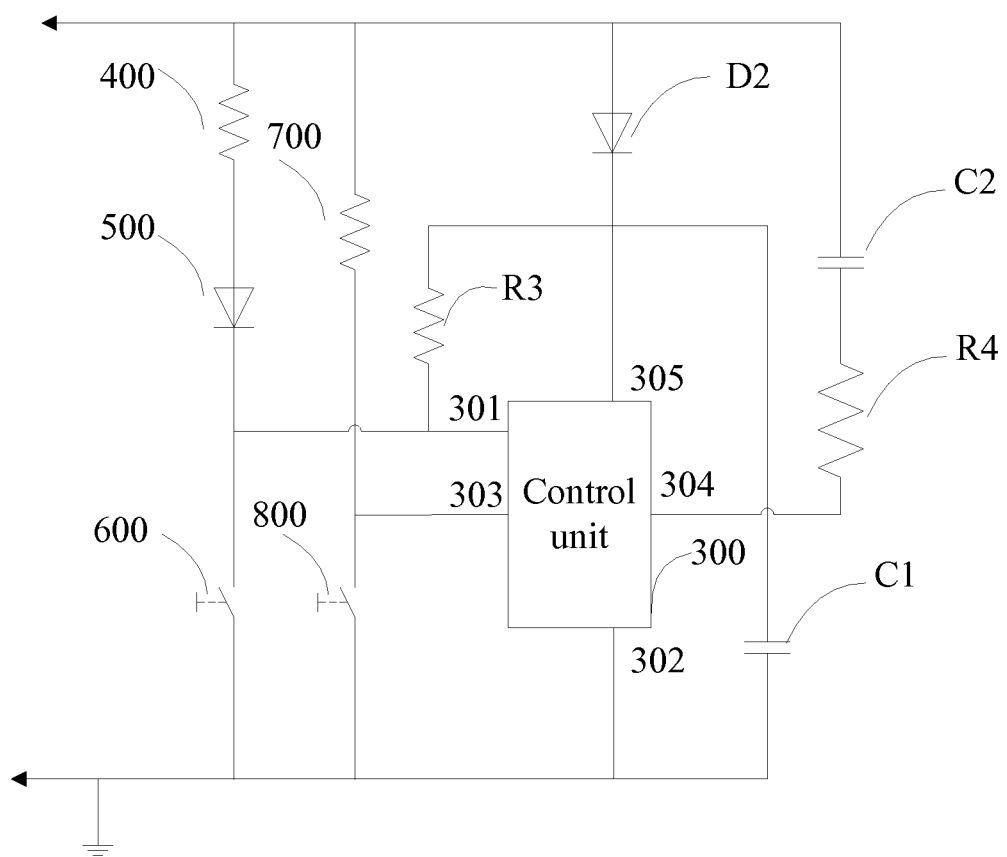
FIG. 7 is a block diagram of an earphone line control device in accordance with another embodiment.

Referring to Fig.7, FIG. 7 is a block diagram of an earphone line control device in accordance with another embodiment. In the embodiment, the filter unit 200 consists of a second capacitance C2 connecting in series with a fourth resistance R4.

Figure 8:
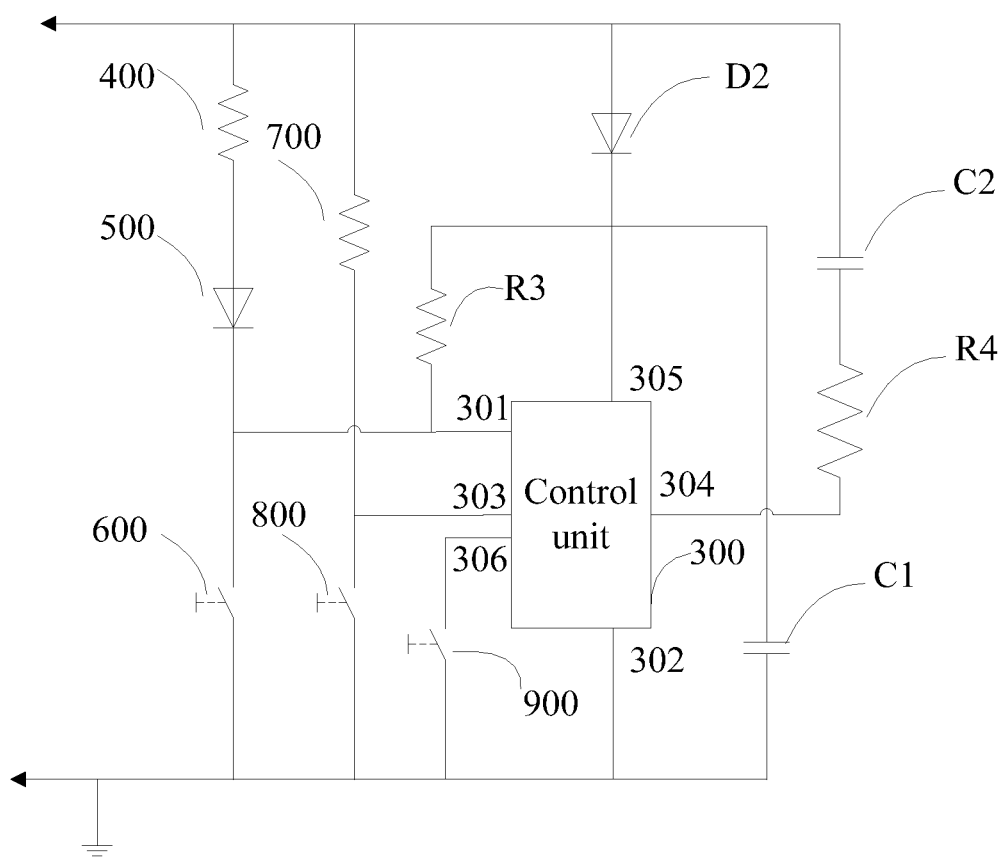
FIG. 8 is a block diagram of an earphone line control device in accordance with another embodiment.

Referring to FIG. 8, FIG. 8 is a block diagram of an earphone line control device in accordance with another embodiment. The earphone line control device further includes a third switch 900. An end of the third switch 900 is connected to the sixth end 306 of the control unit 300, and the other end of the third switch 900 is connected to ground. When the third switch 900 is turned on or turned off, the control unit 300 outputs a third preset coded pulse signal, the mobile phone connected to the earphone decodes the coded pulse signal, and implements different functions by running different application programs (APP), e.g. leaving wechat voice massages, playing wechat voice massages, taking photos, turning volume up/down, song move previous/move next, screen scraping, and voice controlling.

In an embodiment, the coded pulse signal is a low frequency stage signal in the range of 20 HZ-20 KHZ.

In another embodiment, the first switch is a VOL DOWN (−) switch of the earphone line control device, the second switch is a VOL UP (+) switch of the earphone line control device, and the third switch is a PLAY/PAUSE switch of the earphone line control device. The control unit 300 achieves different functions by detecting the states of above-described three switches.

The embodiments described above only show a few implement manners of the present invention, the description is specific and detailed, but it cannot be interpreted as a limitation of the range of the present invention. What should be pointed out is that it is apparent to those skilled in the art that a variety of modifications and changes may be made without departing from the scope of the present invention. Thus, the range of the present invention should be defined by the appended claims.

What is claimed is:

1. An earphone line control device comprising a power supply management unit, a filter unit, a control unit, a first resistance, a first diode, a first switch, a second resistance and a second switch, wherein;
a first end of the power supply management unit, a first end of the filter unit, an end of the first resistance, and an end of the second resistance are all connected to a power supply;
the other end of the first resistance is connected to an anode of the first diode, a cathode of the first diode is connected to an end of the first switch, the other end of the second resistance is connected to an end of the second switch, the other end of the first switch and the other end of the second switch are both connected to ground;
a first end and a third end of the control unit are respectively connected to the cathode of the first diode and the other end of the second resistance, a second end of the control unit is connected to ground, a forth end of the control unit is connected to the other end of the filter unit;
a second end of the power supply management unit is connected to ground, a third end of the power supply management unit is connected to the control unit ;
the first switch corresponds to the first resistance, the second switch corresponds to the second resistance; when the first switch or the second switch is turned on, the control unit outputs a first preset coded pulse signal, the first resistance or the second resistance divides voltage with an internal circuit of a mobile phone and generates a different voltage value; when the first switch or the second switch is turned off, the control unit outputs a second preset coded pulse signal.

2. The earphone line control device according to claim 1, wherein when the first switch or the second switch is turned on, the control unit respectively outputs a first preset coded pulse signal with different frequency.

3. The earphone line control device according to claim 1, wherein the earphone line control device further comprises a third switch, an end of the third switch is directly connected to a sixth end of the control unit, the other end of the third switch is connected to ground; when the third switch is turned on, the control unit outputs a third preset coded audio signal.

4. The earphone line control device according to claim 1, wherein the power supply management unit comprises a second diode and a first capacitance, an anode of the second diode is connected to the power supply, a cathode of the second diode is connected to an end of the first capacitance, the other end of the first capacitance is connected to ground.

5. The earphone line control device according to claim 1, wherein the filter unit comprises a second capacitance connecting in series with a fourth resistance.

6. The earphone line control device according to claim 1, wherein a fourth end of the power supply management unit is connected to the first end of the control unit.

7. The earphone line control device according to claim 6, wherein the earphone line control device further comprises a third switch, an end of the third switch is connected to the sixth end of the control unit, the other end of the third switch is connected to ground; when the third switch is turned on, the control unit outputs a third preset coded pulse signal.

8. The earphone line control device according to claim 6, wherein the power supply management unit comprises a second diode, a third resistance and a first capacitance, an anode of the second diode is connected to the power supply, a cathode of the second diode is connected to an end of the third resistance and an end of the first capacitance, the other end of the third resistance is connected to the first end of the control unit, the other end of the first capacitance is connected to ground.

9. The earphone line control device according to claim 6, wherein the filter unit comprises a second capacitance connecting in series with a fourth resistance.

10. An earphone comprising an audible unit, an earphone line control device, a plug, and a cable receiving the audible unit, the earphone line control device and the plug, wherein the line control device comprises:
a power supply management unit, a filter unit, a control unit, a first resistance, a first diode, a first switch, a second resistance and a second switch, wherein;
a first end of the power supply management unit, a first end of the filter unit, an end of the first resistance, and an end of the second resistance are all connected to a power supply;
the other end of the first resistance is connected to an anode of the first diode, a cathode of the first diode is connected to an end of the first switch, the other end of the second resistance is connected to an end of the second switch, the other end of the first switch and the other end of the second switch are both connected to ground;
a first end and a third end of the control unit are respectively connected to the cathode of the first diode and the other end of the second resistance, a second end of the control unit is connected to ground, a fourth end of the control unit is connected to the other end of the filter unit;
a second end of the power supply management unit is connected to ground, a third end of the power supply management unit is connected to the control unit ;
the first switch corresponds to the first resistance, the second switch corresponds to the second resistance; when the first switch or the second switch is turned on, the control unit outputs a first preset coded pulse signal, the first resistance or the second resistance divides voltage with an internal circuit of a mobile phone and generates a different voltage value; when the first switch or the second switch is turned off, the control unit outputs a second preset coded pulse signal.

11. The earphone according to claim 10, wherein when the first switch or the second switch is turned on, the control unit outputs a first preset coded pulse signal with different frequency.

12. The earphone according to claim 10, wherein the line control device further comprises a third switch, an end of the third switch is directly connected to a sixth end of the control unit, the other end of the third switch is connected to ground; when the third switch is turned on, the control unit outputs a third preset coded audio signal.

13. The earphone according to claim 10, wherein the power supply management unit comprises a second diode and a first capacitance, an anode of the second diode is connected to the power supply, a cathode of the second diode is connected to an end of the first capacitance, the other end of the first capacitance is connected to ground.

14. The earphone according to claim 10, wherein the filter unit comprises a second capacitance connecting in series with a fourth resistance.

15. The earphone according to claim 10, wherein a fourth end of the power supply management unit is connected to the first end of the control unit.

16. The earphone according to claim 15, wherein the line control device further comprises a third switch, an end of the third switch is connected to the sixth end of the control unit, the other end of the third switch is connected to ground;
   when the third switch is turned on, the control unit outputs a third preset coded pulse signal.

17. The earphone according to claim 15, wherein the power supply management unit comprises a second diode, a third resistance and a first capacitance, an anode of the second diode is connected to the power supply, a cathode of the second diode is connected to an end of the third resistance and an end of the first capacitance, the other end of the third resistance is connected to first end of the control unit, the other end of the first capacitance is connected to ground.

18. The earphone according to claim 15, wherein the filter unit comprises a second capacitance connecting in series with a fourth resistance.

* * * * *